United States Patent
Wu

(10) Patent No.: US 11,777,460 B2
(45) Date of Patent: Oct. 3, 2023

(54) OPERATIONAL AMPLIFIER

(71) Applicant: SANECHIPS TECHNOLOGY CO., LTD., Shenzhen (CN)

(72) Inventor: Yiqiang Wu, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 12 days.

(21) Appl. No.: 17/622,761

(22) PCT Filed: Sep. 7, 2020

(86) PCT No.: PCT/CN2020/113754
§ 371 (c)(1),
(2) Date: Dec. 24, 2021

(87) PCT Pub. No.: WO2021/047475
PCT Pub. Date: Mar. 18, 2021

(65) Prior Publication Data
US 2022/0278661 A1  Sep. 1, 2022

(30) Foreign Application Priority Data
Sep. 9, 2019 (CN) .......................... 201910846512.2

(51) Int. Cl.
*H03F 3/45* (2006.01)
*H03F 1/02* (2006.01)

(52) U.S. Cl.
CPC ..... *H03F 3/45188* (2013.01); *H03F 3/45273* (2013.01); *H03F 2203/45156* (2013.01); *H03F 2203/45222* (2013.01)

(58) Field of Classification Search
CPC ............. H03F 3/45188; H03F 3/45273; H03F 2203/45156; H03F 2203/45222;
(Continued)

(56) References Cited

U.S. PATENT DOCUMENTS 9,294,042 B2   3/2016 Scott et al.
9,716,470 B2*  7/2017 Bandyopadhyay ..........................
                                                  H03F 3/45192
(Continued)

FOREIGN PATENT DOCUMENTS

CN   104767496 A   7/2015
CN   105720927 A   6/2016
CN   106026954 A   10/2016

OTHER PUBLICATIONS

European Patent Office. Extended European Search Report for EP Application No. 20863671.2, dated Jul. 5, 2022, pp. 1-8.
(Continued)

*Primary Examiner* — Hieu P Nguyen
(74) *Attorney, Agent, or Firm* — Vivacqua Crane, PLLC

(57) ABSTRACT

Disclosed is an operational amplifier, including a first-stage gain circuit, a second-stage gain circuit, and a tail current compensation circuit. The first-stage gain circuit is connected to the second-stage gain circuit, the first-stage gain circuit is provided with an input terminal, the second-stage gain circuit is provided with an output terminal. The first-stage gain circuit at least includes a tail current source, a first terminal of the tail current compensation circuit is connected to the tail current source, and a second terminal of the tail current compensation circuit is connected to the output terminal of the second-stage gain circuit. The tail current compensation circuit is configured to compensate the tail current source with an output signal of the output terminal of the second-stage gain circuit.

9 Claims, 11 Drawing Sheets

(58) Field of Classification Search
CPC .............. H03F 1/14; H03F 2203/45466; H03F 2203/45512; H03F 2203/45526; H03F 1/0211; H03F 3/68; H03F 3/45183
USPC .................................. 330/252–261, 310–311
See application file for complete search history.

(56) References Cited

U.S. PATENT DOCUMENTS

| | | |
|---|---|---|
| 2009/0289703 A1 | 11/2009 | Kojima et al. |
| 2010/0007419 A1 | 1/2010 | Gilbert |
| 2014/0361833 A1 | 12/2014 | Rey-Losada et al. |
| 2016/0344344 A1 | 11/2016 | Bandyopadhyay |

OTHER PUBLICATIONS

International Searching Authority, International Search Report and Written Opinion for PCT Application No. PCT/CN2020/113754 and English translation, dated Dec. 8, 2020, pp. 1-10.

\* cited by examiner

OPERATIONAL AMPLIFIER

CROSS-REFERENCE TO RELATED APPLICATION

This application is a national stage filing under 35 U.S.C. § 371 of international application number PCT/CN2020/113754, filed Sep. 7, 2020, which claims priority to Chinese patent application No. 201910846512.2 filed Sep. 9, 2019. The contents of these applications are incorporated herein by reference in their entirety.

TECHNICAL FIELD

The present application relates to, but not limited to, an operational amplifier.

BACKGROUND

With the development of complementary metal oxide semiconductor (CMOS) technology and the improvement of the systematization level of a system-on-a-chip (SoC), the SoC as a wireless transceiver chip not only integrates a radio-frequency transceiver, a digital-to-analog converter and an analog-to-digital converter, but also integrates a digital signal processor and other large-scale digital circuits. Since a radio-frequency circuit is more sensitive to power noise interference, power noise will directly affect the performances of the radio-frequency circuit. In particular, power noise of a higher frequency will be modulated to useful frequency points, which will eventually affect receiving and transmitting performances.

A low dropout regulator (LDO) circuit having low power consumption is a key device for supplying power to key circuits and rejecting power noise. At present, a power supply rejection ratio is usually used to measure the ability of the LDO to reject noise. An operational amplifier, as a core module in the LDO, has a power supply rejection ratio which directly affects the power supply rejection performance of the entire LDO circuit. Therefore, there is a need to improve the power supply rejection characteristic of the operational amplifier to ensure the system performance.

At present, technologies such as cascode, negative feedback, and additional power supply rejection circuits are mainly used to improve the power supply rejection characteristic of the operational amplifier. Meanwhile, in order to ensure that the operational amplifier can operate normally, Miller compensation/cascode compensation is also used to improve the stability of the operational amplifier. However, Miller compensation/cascode compensation will introduce power supply rejection deterioration, especially at higher frequencies.

SUMMARY

Embodiments of the present application provide an operational amplifier to avoid power supply rejection deterioration at high frequencies.

Embodiments of the present application provide an operational amplifier. The operational amplifier includes a first-stage gain circuit, a second-stage gain circuit and a tail current compensation circuit. The first-stage gain circuit is connected to the second-stage gain circuit, the first-stage gain circuit is provided with an input terminal, the second-stage gain circuit is provided with an output terminal. The first-stage gain circuit at least includes a tail current source, a first terminal of the tail current compensation circuit is connected to the tail current source, and a second terminal of the tail current compensation circuit is connected to the output terminal of the second-stage gain circuit. The tail current compensation circuit is configured to compensate the tail current source with an output signal of the output terminal of the second-stage gain circuit.

DETAILED DESCRIPTION

In the existing technologies relevant to the application, in order to ensure normal operation of an operational amplifier, Miller compensation/cascode compensation is used to improve the stability of the amplifier. In this case, power noise will be directly coupled to an output terminal of the operational amplifier through a compensation capacitor, thereby reducing the power supply rejection characteristic of the operational amplifier and introducing power supply rejection deterioration, especially power supply rejection deterioration at higher frequencies. In other words, the operational amplifier based on Miller compensation/cascode compensation will introduce power supply rejection degradation, especially power supply rejection degradation at higher frequencies.

Figure 1:
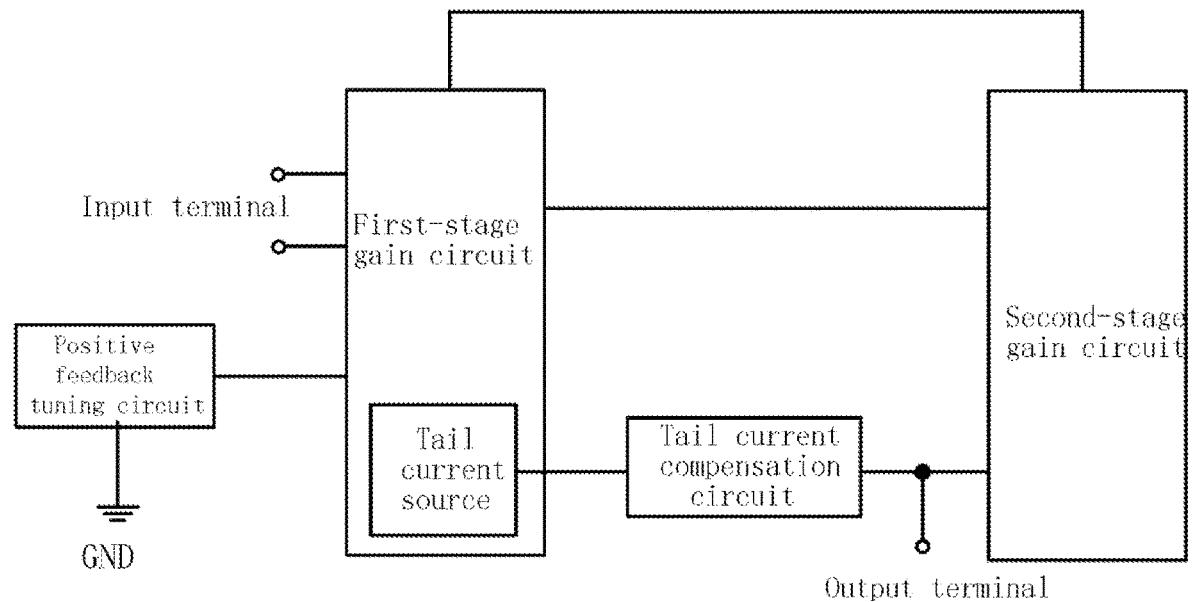
FIG. 1 is a schematic structural diagram of an operational amplifier provided by an embodiment of the present application.

An embodiment of the present application provides an operational amplifier. As shown in FIG. 1, the operational amplifier includes a first-stage gain circuit, a second-stage gain circuit and a tail current compensation circuit.

In this embodiment, the first-stage gain circuit is connected to the second-stage gain circuit. The first-stage gain circuit is provided with an input terminal. The second-stage gain circuit is provided with an output terminal. The first-stage gain circuit at least includes a tail current source.

A first terminal of the tail current compensation circuit is connected to the tail current source, and a second terminal of the tail current compensation circuit is connected to the output terminal of the second-stage gain circuit; and the tail current compensation circuit is configured to compensate the tail current source with an output signal of the output terminal of the second-stage gain circuit.

In this embodiment of the present application, instead of the traditional pole-splitting in Miller compensation technology, the tail current compensation circuit is used to alleviate the power supply rejection deterioration caused by the introduction of a compensation capacitor at high frequencies and improve the power supply rejection characteristic of the operational amplifier while ensuring the stability of the circuit.

As shown in FIG. 1, in an embodiment, the operational amplifier further includes a positive feedback tuning circuit. A first terminal of the positive feedback tuning circuit is connected to the first-stage gain circuit, and a second terminal of the positive feedback tuning circuit is connected to ground. The positive feedback tuning circuit is configured to reject a positive feedback signal introduced by the tail current compensation circuit.

In this embodiment, the first-stage gain circuit implements input and amplification of a differential signal. The second-stage gain circuit implements amplification of an output signal of the first-stage gain circuit and drives a circuit load. The tail current compensation circuit introduces an additional zero pole to implement a normal closed-loop operation of the operational amplifier. The positive feedback tuning circuit cuts off a positive feedback path introduced by the tail current compensation circuit.

Figure 2:
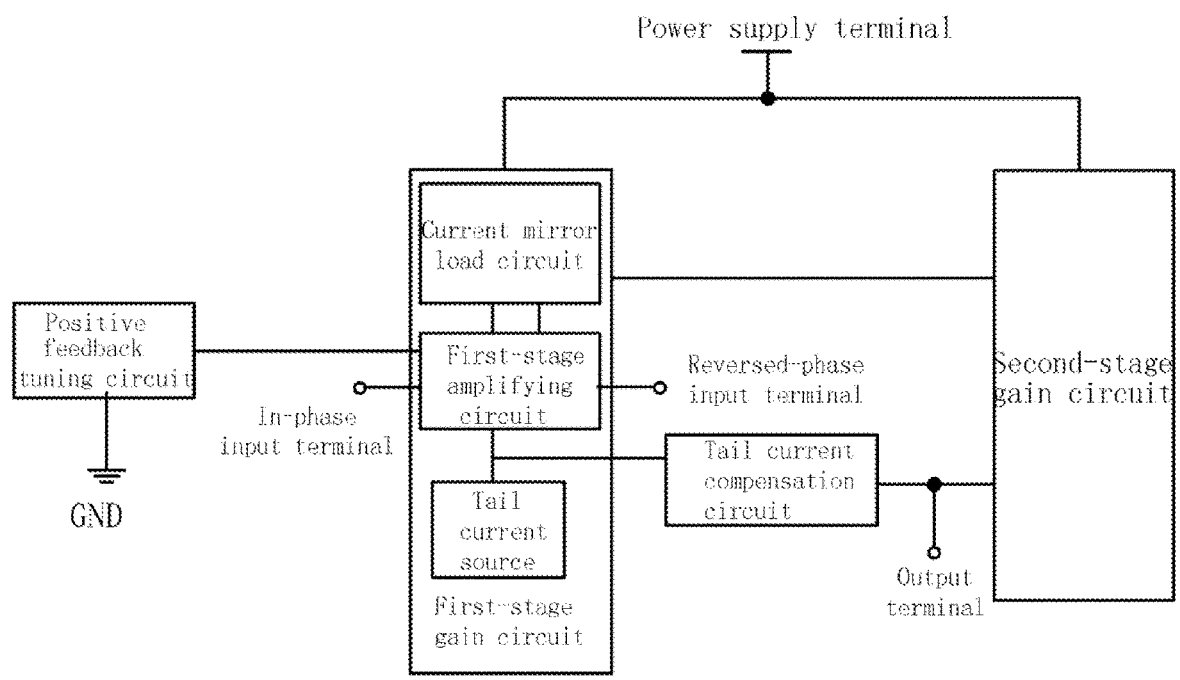
FIG. 2 is a schematic structural diagram of an operational amplifier provided by another embodiment of the present application.

As shown in FIG. 2, the input terminal may include an in-phase input terminal and a reversed-phase input terminal, and the first-stage gain circuit is connected to the in-phase input terminal and the reversed-phase input terminal.

As shown in FIG. 2, the operational amplifier of the present application may further be provided with a power supply terminal to which both the first-stage gain circuit and the second-stage gain circuit are connected. The power supply terminal is externally connected to a power supply and supplies power to the operational amplifier through the external power supply.

In the embodiments of the present application, a main amplifying circuit of the operational amplifier may include a first-stage gain circuit and a second-stage gain circuit. A main signal path is formed by the first-stage gain circuit and the second-stage gain circuit. A left half-plane zero point is formed based on the tail current compensation circuit, such that the phase margin and the amplifier stability are improved. A positive feedback signal introduced by the tail current compensation circuit is rejected through a positive feedback rejection circuit.

As shown in FIG. 2, in an embodiment, the first-stage gain circuit further includes a first-stage amplifying circuit and a current mirror load circuit. The first-stage amplifying circuit is connected to the current mirror load circuit, and also to the tail current source and the tail current compensation circuit.

In an embodiment, the positive feedback tuning circuit is connected to the first-stage amplifying circuit. In another embodiment, the positive feedback tuning circuit is connected to the first-stage amplifying circuit and the current mirror load circuit.

The first-stage amplifying circuit may include an input differential transistor pair. The first terminal of the tail current compensation circuit is connected to a junction between a common source terminal of the input differential transistor pair and the tail current source. The second terminal of the tail current compensation circuit is connected to the output terminal of the second-stage gain circuit. In this way, an effect of tail current compensation can be achieved.

The input differential transistor pair refers to two metal oxide semiconductor (MOS) transistors in the first-stage gain circuit, which are respectively connected to the in-phase input terminal and the reversed-phase input terminal of the operational amplifier. The two MOS transistors may both be negative channel metal oxide semiconductor (NMOS) transistors, or positive channel metal oxide semiconductor (PMOS) transistors. As a part of the first-stage gain circuit, the tail current source is responsible for generating a constant tail current, which can be implemented by at least one MOS transistor. For example, the input differential transistor pair in the circuit structure shown in FIGS. 3 to 6 below includes a NMOS transistor M3 and a NMOS transistor M4. For another example, in the circuit structure shown in FIG. 3 below, a structure including NMOS transistors M1 and M2 is the tail current source of the first-stage gain circuit. In the circuit structure shown in FIG. 6 below, a structure including the NMOS transistor M2 is the tail current source of the first-stage gain circuit.

As described above, an embodiment of the present application provides an operational amplifier based on tail current compensation. The tail current compensation circuit is used to compensate at a junction between a common source terminal of the input differential transistor pair and the tail current source with the output signal of the output terminal of the second-stage gain circuit. The tail current compensation circuit may form a left half-plane zero point, thereby improving the phase margin, avoiding the direct coupling of power noise to the output terminal of the second-stage gain circuit at higher frequencies, and further avoiding power supply rejection deterioration.

In an implementation of the present application, the first-stage amplifier circuit may be a cascode amplifying circuit with differential input and single-ended output. In addition, the first-stage amplifying circuit may also have other circuit structure that can provide circuit gain and have differential input and single-ended output. For example, the first-stage amplifying circuit may also be a common-source amplifying circuit with differential input and single-ended output, or an amplifying circuit with differential input and differential output. The structure of the first-stage amplifying circuit is not limited herein.

In an implementation of the present application, the second-stage gain circuit may be a common-source amplifying circuit with single-ended input and single-ended output. In addition, the second-stage gain circuit may also have other circuit structure that can provide circuit gain and have single-ended input and single-ended output. For example, the second-stage amplifying circuit may also be a cascode amplifying circuit with single-ended input and single-ended output, or an amplifying circuit with differential input and single-ended output. The structure of the second-stage gain circuit is not limited herein.

In some embodiments, when the first-stage amplifying circuit is a cascode amplifying circuit with differential input and single-ended output or a common-source amplifying circuit with differential input and single-ended output, the second-stage gain circuit may be a common-source amplifying circuit with single-ended input or single-ended output or a cascode amplifying circuit with single-ended input and single-ended output.

When the first-stage amplifying circuit is an amplifying circuit with differential input and differential output, the second-stage gain circuit may be an amplifying circuit with differential input and single-ended output.

In the embodiments of the present application, a signal output terminal of the first-stage amplifying circuit is connected to a signal input terminal of the second-stage gain circuit. For example, in the circuit structures shown in FIGS. 3, 4 and 6, a junction between a drain terminal of M6 and a drain terminal of the PMOS transistor M8 functions as a signal output terminal OUT1 of the first-stage amplifying circuit, and is connected to a signal input terminal of the second-stage gain circuit, that is, a gate terminal of M11. For another example, in the circuit structure shown in FIG. 5 below, a junction between a drain terminal of M4 and the drain terminal of M8 functions as a signal output terminal of the first-stage amplifying circuit, and is connected to the signal input terminal of the second-stage gain circuit, that is, the gate terminal of M11.

In the embodiments of the present application, the positive feedback tuning circuit may include a positive feedback tuning capacitor. A positive terminal of the positive feedback tuning capacitor is connected to the first-stage gain circuit, and a negative terminal of the positive feedback tuning capacitor is connected to the ground GND to reject a positive feedback signal which is formed by the tail current compensation circuit and output to the first-stage gain circuit. In an implementation, the positive terminal of the positive feedback tuning capacitor is connected to a drain terminal of the MOS transistor which is connected to the in-phase input terminal of the operational amplifier in the input differential transistor pair of the first-stage gain circuit. It should be noted that the positive feedback tuning circuit in the embodiments of the present application may include one of, or a series-parallel combination of at least two of, a capacitor, a resistor, an inductor and an active device. The structure of the positive feedback tuning circuit is not limited herein.

Figure 7:
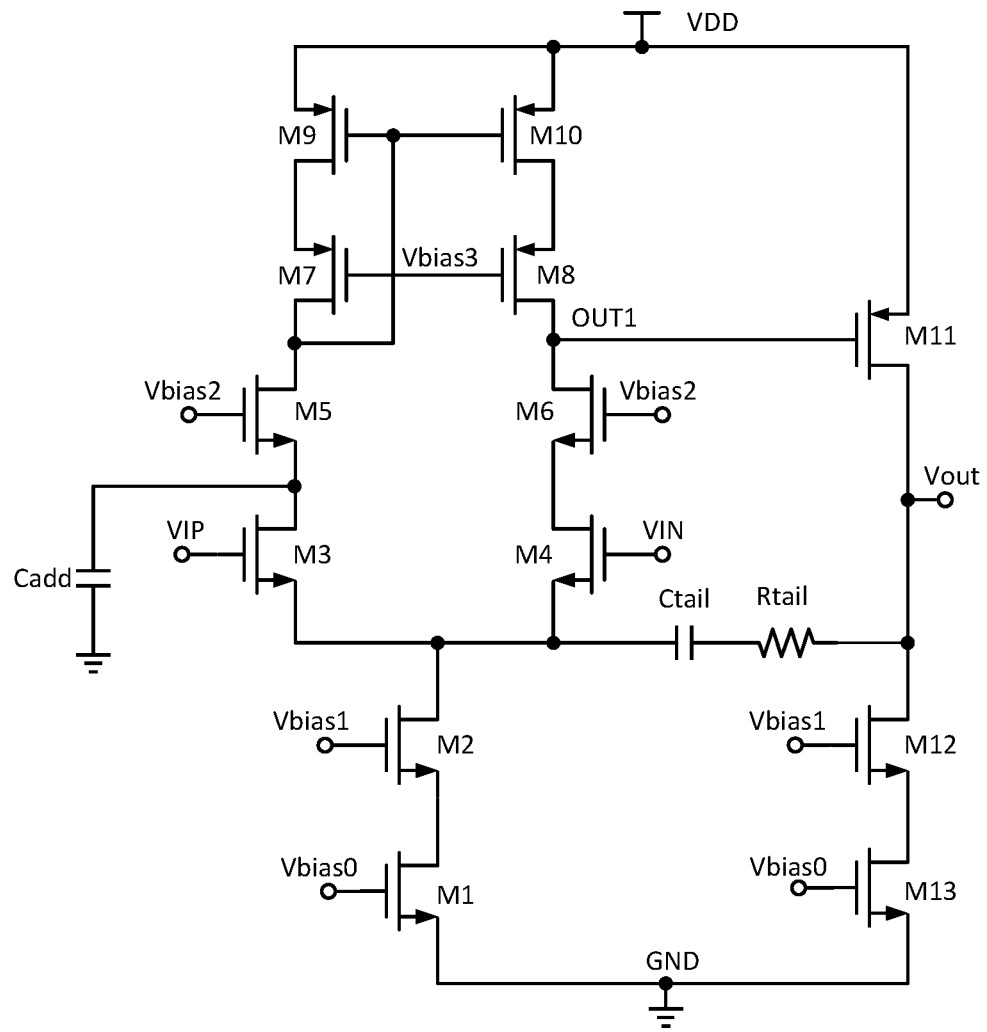
FIG. 7 is a structural diagram of still further circuit of the operational amplifier of the present application.

In the embodiments of the present application, the tail current compensation circuit may include a compensation capacitor. A negative terminal of the compensation capacitor is connected to a junction between the input differential transistor pair and the tail current source in the first-stage gain circuit, and a positive terminal of the compensation capacitor is connected to the output terminal of the second-stage gain circuit. It should be noted that the tail current compensation circuit in the embodiments of the present application may also be implemented by adopting a series structure of the compensation capacitor and a compensation resistor, as shown in FIG. 7. In addition, the tail current compensation circuit may also include one of, or a series-parallel combination of at least two of, a capacitor, a resistor and an inductor, and may also be implemented by active devices.

As described above, in the operational amplifier according to the embodiments of the present application, the tail current compensation is used to isolate the compensation capacitor of the Miller compensation circuit from power noise, and avoid the power supply rejection deterioration caused by the introduction of the compensation capacitor of the Miller compensation circuit at higher frequencies. Meanwhile, because the input differential transistor pair and the input cascode transistor can provide greater current gain, the tail current compensation circuit based on tail current compensation has smaller requirements on the capacitance of the compensation capacitor in comparison to a Miller compensation/cascode compensation circuit with the same phase margin.

The implementation of the operational amplifier in the embodiments of the present application will be described below.

In an embodiment, the operational amplifier may include a first-stage gain circuit, a second-stage gain circuit, a tail current compensation circuit, and a positive feedback tuning circuit. The first-stage gain circuit and the second-stage gain circuit are used as a main signal path. The tail current compensation circuit improves the phase margin of the amplifier. The positive feedback tuning circuit rejects a positive feedback signal introduced by the tail current compensation circuit.

Figure 3:
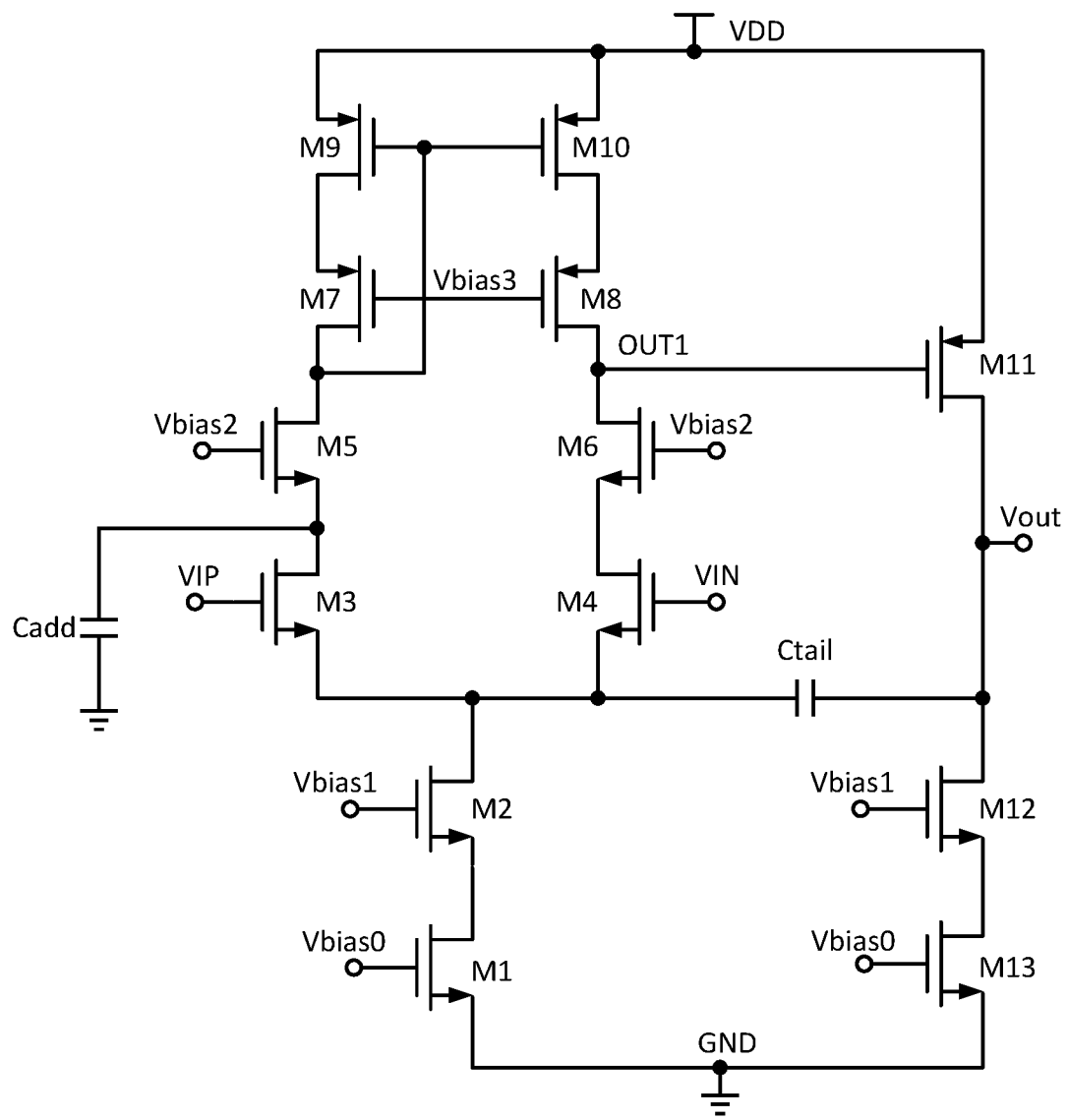
FIG. 3 is a structural diagram of a circuit of the operational amplifier of the present application.

FIG. 3 is a structural diagram of a circuit of the operational amplifier in this embodiment.

As shown in FIG. 3, the operational amplifier in this embodiment is provided with a power supply terminal VDD, an in-phase input terminal VIP, a reversed-phase input terminal VIN, an output terminal Vout, and bias voltage terminals Vbias0/Vbias1/Vbias2/Vbias3.

As shown in FIG. 3, the first-stage gain circuit in this embodiment may include: NMOS transistors M1, M2, M3, M4, M5, M6 and PMOS transistors M7, M8, M9, M10. M1 and M2 form a tail current source, M3 to M6 form a first-stage amplifying circuit (input differential transistor pairs), and M7 to M10 form a current mirror load circuit.

A gate terminal of the NMOS transistor M3 is connected to the in-phase input terminal VIP of the operational amplifier, and a gate terminal of the NMOS transistor M4 is connected to the reversed-phase input terminal VIN of the operational amplifier. Source terminals of M3 and M4 are connected to a drain terminal of the NMOS transistor M2 and a negative terminal of a compensation capacitor Ctail. A drain terminal of M3 is connected to a source terminal of the NMOS transistor M5 and a positive terminal of a positive feedback tuning capacitor Cadd. A drain terminal of M4 is connected to a source terminal of the NMOS transistor M6. Gate terminals of the NMOS transistors M5 and M6 are connected to the bias voltage terminal Vbias2. A drain terminal of M5 is connected to a drain terminal of the PMOS transistor M7 and gate terminals of the PMOS transistors M9 and M10. A junction between a drain terminal of M6 and a drain terminal of the PMOS transistor M8 functions as a signal output terminal OUT1 of the first-stage gain circuit, and the signal output terminal OUT1 of the first-stage gain circuit is connected to a gate terminal of the PMOS transistor M11.

Gate terminals of the PMOS transistors M7 and M8 are connected to the bias voltage terminal Vbias3. A source terminal of M7 is connected to a drain terminal of the PMOS transistor M9, and a source terminal of M8 is connected to a drain terminal of the PMOS transistor M10. Gate terminals of the PMOS transistors M9 and M10 are connected to the drain terminal of the NMOS transistor M5 and the drain terminal of the PMOS transistor M7. Source terminals of M9 and M10 are connected to the power supply terminal VDD.

A gate terminal of the NMOS transistor M2 is connected to the bias voltage terminal Vbias1, and a source terminal of M2 is connected to a drain terminal of the NMOS transistor M1. A gate terminal of the NMOS transistor M1 is connected to the bias voltage terminal Vbias0, and a source terminal of the M1 is connected to the ground GND.

As shown in FIG. 3, the second-stage gain circuit in this embodiment may include: a PMOS transistor M11 and NMOS transistors M12, M13. A gate terminal of the PMOS transistor M11 is connected to the signal output terminal OUT1 (that is, the junction between the drain terminal of M6 and the drain terminal of M8) of the first-stage gain circuit.

A source terminal of M11 is connected to the power supply terminal VDD. A drain terminal of M11 is connected to the output terminal Vout of the operational amplifier, a drain terminal of the NMOS transistor M12 and a positive terminal of the compensation capacitor Ctail. A gate terminal of the NMOS transistor M12 is connected to the bias voltage terminal Vbias1. A source terminal of M12 is connected to a drain terminal of the NMOS transistor M13. A gate terminal of the NMOS transistor M13 is connected to the bias voltage terminal Vbias0, and a source terminal of M13 is connected to the ground GND.

As shown in FIG. 3, the compensation circuit in this embodiment may include the compensation capacitor Ctail. The positive terminal of the compensation capacitor Ctail is connected to the output terminal Vout of the operational amplifier, and also to the drain terminal of the PMOS transistor M11 and the drain terminal of the NMOS transistor M12. The negative terminal of the compensation capacitor Ctail is connected to the source terminals of the NMOS transistors M3 and M4, and the drain terminal of the NMOS transistor M2.

As shown in FIG. 3, the positive feedback tuning circuit in this embodiment may include the positive feedback tuning capacitor Cadd. The positive terminal of the positive feedback tuning capacitor Cadd is connected to the drain terminal of the NMOS transistor M3 and the source terminal of the NMOS transistor M5. The negative terminal of the positive feedback tuning capacitor Cadd is connected to the ground GND.

In an embodiment, the operational amplifier may include a first-stage gain circuit, a second-stage gain circuit, a tail current compensation circuit, and a positive feedback tuning circuit. The first-stage gain circuit and the second-stage gain circuit are used as a main signal path. The tail current compensation circuit improves the phase margin of the amplifier. The positive feedback tuning circuit rejects a positive feedback signal introduced by the tail current compensation circuit.

Figure 4:
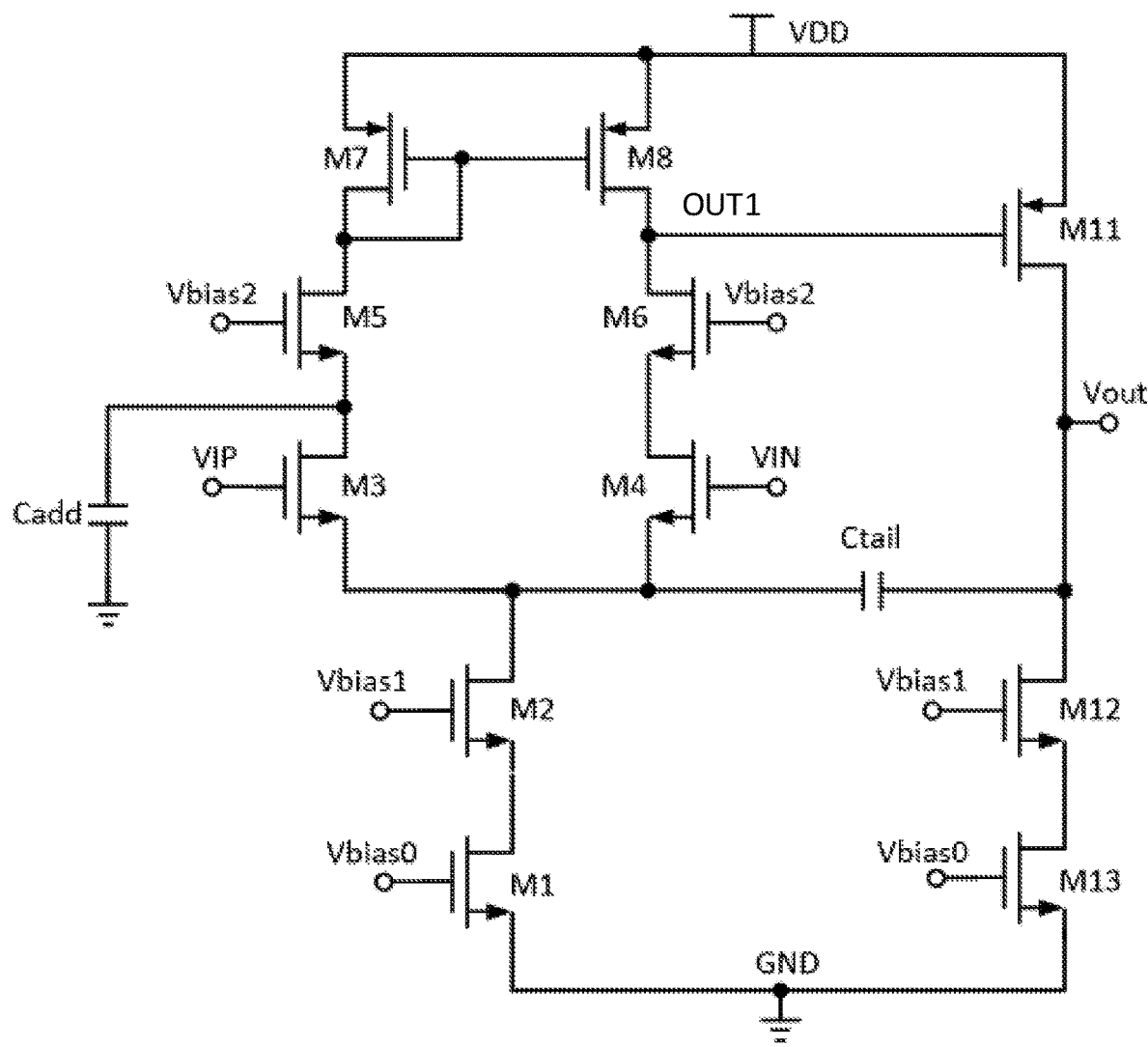
FIG. 4 is a structural diagram of another circuit of the operational amplifier of the present application.

FIG. 4 is a structural diagram of a circuit of the operational amplifier in this embodiment.

As shown in FIG. 4, the operational amplifier in this embodiment is provided with a power supply terminal VDD, an in-phase input terminal VIP, a reversed-phase input terminal VIN, an output terminal Vout, and bias voltage terminals Vbias0/Vbias1/Vbias2.

As shown in FIG. 4, the first-stage gain circuit in this embodiment may include: NMOS transistors M1, M2, M3, M4, M5, M6 and PMOS transistors M7, M8. M1 and M2 form a tail current source, M3 to M6 form a first-stage amplifying circuit (input differential transistor pairs), and M7 to M8 form a current mirror load circuit.

A gate terminal of the NMOS transistor M3 is connected to the in-phase input terminal VIP of the operational amplifier, and a gate terminal of the NMOS transistor M4 is connected to the reversed-phase input terminal VIN of the operational amplifier. Source terminals of M3 and M4 are connected to a drain terminal of the NMOS transistor M2 and a negative terminal of a compensation capacitor Ctail. A drain terminal of M3 is connected to a source terminal of the NMOS transistor M5 and a positive terminal of a positive feedback tuning capacitor Cadd. A drain terminal of M4 is connected to a source terminal of the NMOS transistor M6. Gate terminals of the NMOS transistors M5 and M6 are connected to the bias voltage terminal Vbias2. A drain terminal of M5 is connected to a drain terminal of the PMOS transistor M7. A drain terminal of M6 is connected to a drain terminal of the PMOS transistor M8. A junction between the drain terminal of M6 and the drain terminal of the PMOS transistor M8 functions as a signal output terminal OUT1 of the first-stage amplifying circuit, and the signal output terminal OUT1 of the first-stage amplifying circuit is connected to a signal input terminal (i.e., a gate terminal of the PMOS M11) of the second-stage gain circuit.

Gate terminals of PMOS transistors M7 and M8 are connected to the drain terminal of the NMOS transistor M5 and the drain terminal of the PMOS transistor M7. Source terminals of M7 and M8 are connected to the power supply terminal VDD, respectively.

A gate terminal of the NMOS transistor M2 is connected to the bias voltage terminal Vbias1, and a source terminal of M2 is connected to a drain terminal of the NMOS transistor M1. A gate terminal of the NMOS transistor M1 is connected to the bias voltage terminal Vbias0, and a source terminal of the M1 is connected to the ground GND.

As shown in FIG. 4, the second-stage gain circuit in this embodiment may include: a PMOS transistor M11 and NMOS transistors M12, M13. A gate terminal of the PMOS transistor M11 is connected to the signal output terminal OUT1 (that is, the junction between the drain terminal of M6 and the drain terminal of M8) of the first-stage gain circuit, a source terminal of M11 is connected to the power supply terminal VDD, and a drain terminal of M11 is connected to the output terminal Vout of the operational amplifier, a drain terminal of the NMOS transistor M12 and a positive terminal of a compensation capacitor Ctail. A gate terminal of the NMOS transistor M12 is connected to the bias voltage terminal Vbias1. A source terminal of M12 is connected to a drain terminal of the NMOS transistor M13. A gate terminal of the NMOS transistor M13 is connected to the bias voltage terminal Vbias0, and a source terminal of M13 is connected to the ground GND.

As shown in FIG. 4, the structures and connection relationship of a compensation circuit and a positive feedback tuning circuit in this embodiment are the same as those in the embodiment corresponding to FIG. 3, and will not be repeated here.

In an embodiment, the operational amplifier may include a first-stage gain circuit, a second-stage gain circuit, a tail current compensation circuit, and a positive feedback tuning circuit. The first-stage gain circuit and the second-stage gain circuit are used as a main signal path. The tail current compensation circuit improves the phase margin of the amplifier. The positive feedback tuning circuit rejects a positive feedback signal introduced by the tail current compensation circuit.

Figure 5:
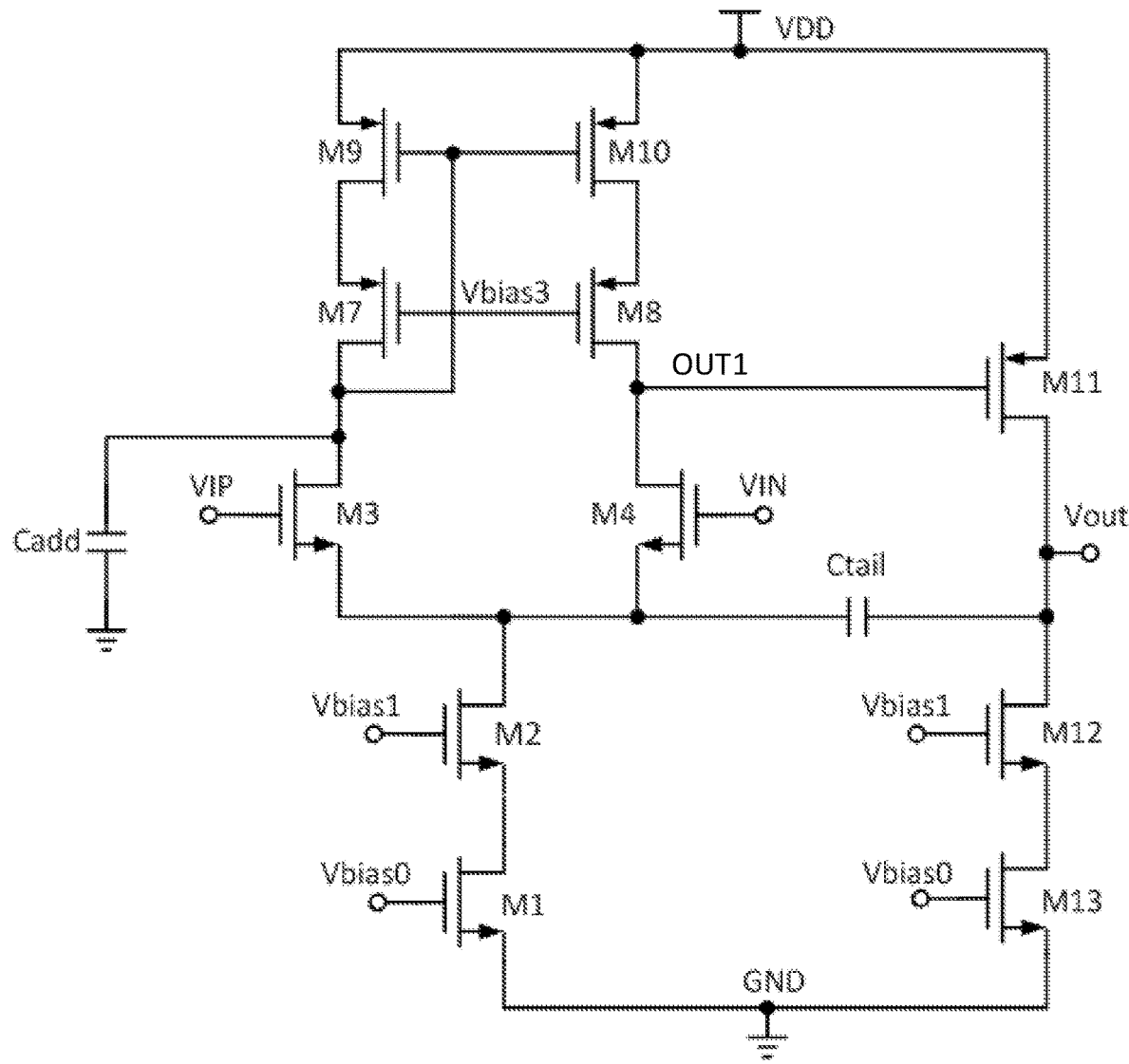
FIG. 5 is a structural diagram of yet another circuit of the operational amplifier of the present application.

FIG. 5 is a structural diagram of a circuit of the operational amplifier in this embodiment.

As shown in FIG. 5, the operational amplifier in this embodiment is provided with a power supply terminal VDD, an in-phase input terminal VIP, a reversed-phase input terminal VIN, an output terminal Vout, and bias voltage terminals Vbias0/Vbias1/Vbias3.

As shown in FIG. 5, the first-stage gain circuit in this embodiment may include: NMOS transistors M1, M2, M3, M4 and PMOS transistors M7, M8, M9, M10. M1 and M2 from a tail current source, M3 to M4 form a first-stage amplifying circuit (input differential transistor pair), and M7 to M10 form a current mirror load circuit.

A gate terminal of the NMOS transistor M3 is connected to the in-phase input terminal VIP of the operational amplifier, and a gate terminal of the NMOS transistor M4 is connected to the reversed-phase input terminal VIN of the operational amplifier. Source terminals of M3 and M4 are connected to a drain terminal of the NMOS transistor M2 and a negative terminal of a compensation capacitor Ctail. A drain terminal of M3 is connected to a drain terminal of the NMOS transistor M7 and a positive terminal of a positive feedback tuning capacitor Cadd. A drain terminal of M4 is connected to a drain terminal of the PMOS transistor M8. A junction between the drain terminal of M4 and the drain terminal of the PMOS transistor M8 functions as a signal output terminal OUT1 of the first-stage amplifying circuit, and the signal output terminal OUT1 of the first-stage amplifying circuit is connected to a signal input terminal (i.e., a gate terminal of the PMOS transistor M11) of the second-stage gain circuit.

Gate terminals of the PMOS transistors M7 and M8 are connected to the bias voltage terminal Vbias3. A source terminal of M7 is connected to a drain terminal of the PMOS transistor M9, and a source terminal of M8 is connected to a drain terminal of the PMOS transistor M10. Gate terminals of PMOS transistors M9 and M10 are connected to the drain terminal of the NMOS transistor M3 and the drain terminal of the PMOS transistor M7. Source terminals of M9 and M10 are connected to the power supply terminal VDD. A gate terminal of the NMOS transistor M2 is connected to the bias voltage terminal Vbias1, and a source terminal of M2 is connected to a drain terminal of the NMOS transistor M1. A gate terminal of the NMOS transistor M1 is connected to the bias voltage terminal Vbias0, and a source terminal of M1 is connected to the ground GND.

As shown in FIG. 5, the second-stage gain circuit in this embodiment may include: a PMOS transistor M11 and NMOS transistors M12, M13. A gate terminal the PMOS transistor M11 is connected to the signal output terminal OUT1 of the first-stage gain circuit (that is, the junction between the drain terminal of M4 and the drain terminal of the PMOS transistor M8). A source terminal of M11 is connected to the power supply terminal VDD. A drain terminal of M11 is connected to the output terminal Vout of the operational amplifier, a drain terminal of the NMOS transistor M12 and a positive terminal of the compensation capacitor Ctail. A gate terminal of the NMOS transistor M12 is connected to the bias voltage terminal Vbias1. A source terminal of M12 is connected to a drain terminal of the NMOS transistor M13. A gate terminal of the NMOS transistor M13 is connected to the bias voltage terminal Vbias0, and a source terminal of M13 is connected to the ground GND.

As shown in FIG. 5, the compensation circuit in this embodiment may include the compensation capacitor Ctail. The positive terminal of the compensation capacitor Ctail is connected to the output terminal Vout of the operational amplifier, and is connected to the drain terminal of the PMOS transistor M11 and the drain terminal of the NMOS transistor M12. A negative terminal of the compensation capacitor Ctail is connected to the source terminals of the NMOS transistors M3 and M4, and the drain terminal of the NMOS transistor M2.

As shown in FIG. 5, the positive feedback tuning circuit in this embodiment may include the positive feedback tuning capacitor Cadd. The positive terminal of the positive feedback tuning capacitor Cadd is connected to the drain terminal of the NMOS transistor M3 and the drain terminal of the NMOS transistor M7. A negative terminal of the positive feedback tuning capacitor Cadd is connected to the ground GND.

In an embodiment, the operational amplifier may include a first-stage gain circuit, a second-stage gain circuit, a tail current compensation circuit, and a positive feedback tuning circuit. The first-stage gain circuit and the second-stage gain circuit are used as a main signal path. The tail current compensation circuit improves the phase margin of the amplifier. The positive feedback tuning circuit rejects a positive feedback signal introduced by the tail current compensation circuit.

Figure 6:
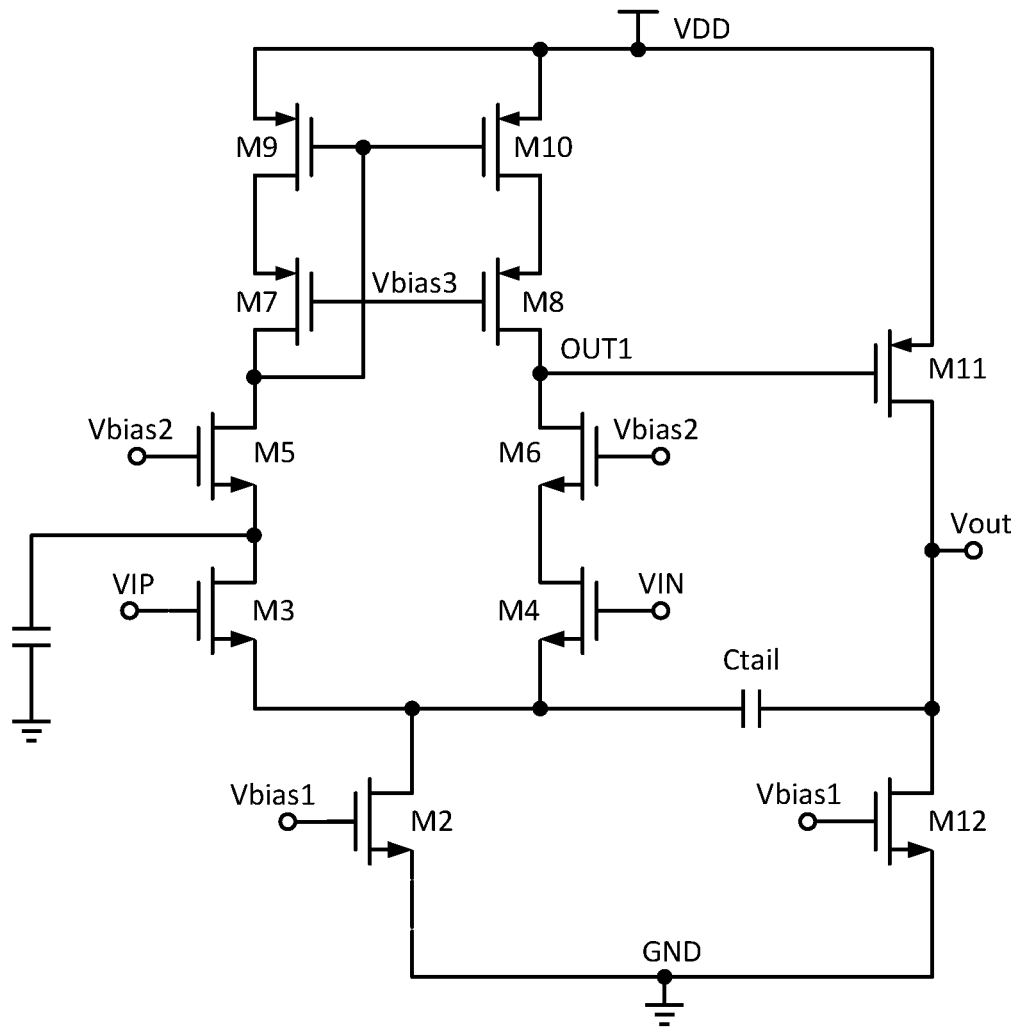
FIG. 6 is a structural diagram of still another circuit of the operational amplifier of the present application.

FIG. 6 is a structural diagram of a circuit of the operational amplifier in this embodiment.

As shown in FIG. 6, the operational amplifier in this embodiment is provided with a power supply terminal VDD, an in-phase input terminal VIP, a reversed-phase input terminal VIN, an output terminal Vout, and bias voltage terminals Vbias1/Vbias2/Vbias3.

As shown in FIG. 6, the first-stage gain circuit in this embodiment may include: NMOS transistors M2, M3, M4 and PMOS transistors M7, M8, M9, M10. M2 is a tail current source, M3 to M6 form a first-stage amplifying circuit (input differential transistor pairs), and M7 to M10 form a current mirror load circuit.

Gate terminals of the NMOS transistors M3 and M4 are connected to the in-phase input terminal VIP of the operational amplifier, and the gate terminal of the NMOS transistor M4 is connected to the reversed-phase input terminal VIN of the operational amplifier. Source terminals of M3 and M4 are connected to a drain terminal of the NMOS transistor M1 and a negative terminal of a compensation capacitor Ctail. A drain terminal of M3 is connected to a source terminal of the NMOS transistor M5 and a positive terminal of a positive feedback tuning capacitor Cadd. A drain terminal of M4 is connected to a source terminal of the NMOS transistor M6. Gate terminals of the NMOS transistors M5 and M6 are connected to the bias voltage terminal Vbias2. A drain terminal of M5 is connected to a drain terminal of the PMOS transistor M7 and gate terminals of the PMOS transistors M9 and M10. A drain terminal of M6 is connected to a drain terminal of the PMOS transistor M8. A junction between the drain terminal of M6 and the drain terminal of the PMOS transistor M8 functions as a signal output terminal OUT1 of the first-stage amplifying circuit, and the signal output terminal OUT1 of the first-stage amplifying circuit is connected to a signal input terminal (i.e., a gate terminal of the PMOS M11) of the second-stage gain circuit.

Gate terminals of the PMOS transistors M7 and M8 are connected to the bias voltage terminal Vbias3. A source terminal of M7 is connected to a drain terminal of the PMOS transistor M9, and a source terminal of M8 is connected to a drain terminal of the PMOS transistor M10. Gate terminals of PMOS transistors M9 and M10 are connected to the drain terminal of the NMOS transistor M5 and the drain terminal of the PMOS transistor M7. Source terminals of M9 and M10 are connected to the power supply terminal VDD. A gate terminal of the NMOS transistor M2 is connected to the bias voltage terminal Vbias1, and a source terminal of M2 is connected to the ground GND.

As shown in FIG. 6, the second-stage gain circuit in this embodiment may include a PMOS transistor M11 and a NMOS transistor M12. A gate terminal of the PMOS transistor M11 is connected to the signal output terminal OUT1 (that is, the junction between the drain terminal of M6 and the drain terminal of M8) of the first-stage gain circuit. A source terminal of M11 is connected to the power supply terminal VDD. A drain terminal of M11 is connected to the output terminal Vout of the operational amplifier, a drain terminal of the NMOS transistor M12 and a positive terminal of the compensation capacitor Ctail. A gate terminal of the NMOS transistor M12 is connected to the bias voltage terminal Vbias1. A source terminal of M12 is connected to the ground GND.

As shown in FIG. 6, the compensation circuit in this embodiment may include the compensation capacitor Ctail. The positive terminal of the compensation capacitor Ctail is connected to the output terminal Vout of the operational amplifier, and is connected to the drain terminal of the PMOS transistor M11 and the drain terminal of the NMOS transistor M12. The negative terminal of the compensation capacitor Ctail is connected to the source terminals of the NMOS transistors M3 and M4, and the drain terminal of the NMOS transistor M2.

As shown in FIG. 6, the positive feedback tuning circuit in this embodiment may include the positive feedback tuning capacitor Cadd. The positive terminal of the positive feedback tuning capacitor Cadd is connected to the drain terminal of the NMOS transistor M3 and the source terminal of the NMOS transistor M5. A negative terminal of the positive feedback tuning capacitor Cadd is connected to the ground GND.

In an embodiment, the operational amplifier may include a first-stage gain circuit, a second-stage gain circuit, a tail current compensation circuit, and a positive feedback tuning circuit. The first-stage gain circuit and the second-stage gain circuit are used as a main signal path. The tail current compensation circuit improves the phase margin of the amplifier. The positive feedback tuning circuit rejects a positive feedback signal introduced by the tail current compensation circuit.

FIG. 7 is a structural diagram of a circuit of the operational amplifier in this embodiment.

As shown in FIG. 7, the operational amplifier in this embodiment is provided with a power supply terminal VDD, an in-phase input terminal VIP, a reversed-phase input terminal VIN, an output terminal Vout, and bias voltage terminals Vbias0/Vbias1/Vbias2/Vbias3.

As shown in FIG. 7, the first-stage gain circuit in this embodiment may include: NMOS transistors M1, M2, M3, M4, M5, M6 and PMOS transistors M7, M8, M9, M10. M1 and M2 form a tail current source, M3 to M6 form a first-stage amplifying circuit (input differential transistor pairs), and M7 to M10 form a current mirror load circuit.

Gate terminals of the NMOS transistors M3 and M4 are connected to the in-phase input terminal VIP of the operational amplifier, and the gate terminal of the NMOS transistor M4 is connected to the reversed-phase input terminal VIN of the operational amplifier. Source terminals of M3 and M4 are connected to a drain terminal of the NMOS transistor M2 and a negative terminal of a compensation capacitor Ctail. A drain terminal of M3 is connected to a source terminal of the NMOS transistor M5 and a positive terminal of a positive feedback tuning capacitor Cadd. A drain terminal of M4 is connected to a source terminal of the NMOS transistor M6. Gate terminals of the NMOS transistors M5 and M6 are connected to the bias voltage terminal Vbias2. A drain terminal of M5 is connected to a drain terminal of the PMOS transistor M7 and gate terminals of the PMOS transistors M9 and M10. A junction between a drain terminal of M6 and a drain terminal of the PMOS transistor M8 functions as a signal output terminal OUT1 of the first-stage gain circuit, and the signal output terminal OUT1 of the first-stage gain circuit is connected to a gate terminal of the PMOS transistor M11.

Gate terminals of the PMOS transistors M7 and M8 are connected to the bias voltage terminal Vbias3. A source terminal of M7 is connected to a drain terminal of the PMOS transistor M9, and a source terminal of M8 is connected to a drain terminal of the PMOS transistor M10. Gate terminals of PMOS transistors M9 and M10 are connected to the drain terminal of the NMOS transistor M5 and the drain terminal of the PMOS transistor M7. Source terminals of M9 and M10 are connected to the power supply terminal VDD.

A gate terminal of the NMOS transistor M2 is connected to the bias voltage terminal Vbias1, and a source terminal of M2 is connected to a drain terminal of the NMOS transistor M1. A gate terminal of the NMOS transistor M1 is connected to the bias voltage terminal Vbias0, and a source terminal of M1 is connected to the ground GND.

As shown in FIG. 7, the second-stage gain circuit in this embodiment may include: a PMOS transistor M11 and NMOS transistors M12, M13. A gate terminal of the PMOS transistor M11 is connected to the signal output terminal OUT1 (that is, the junction between the drain terminal of M6 and the drain terminal of M8) of the first-stage gain circuit. A source terminal of M11 is connected to the power supply terminal VDD. A drain terminal of M11 is connected to the output terminal Vout of the operational amplifier, a drain terminal of the NMOS transistor M12 and a positive terminal of a compensation resistor Rtail. A gate terminal of the NMOS transistor M12 is connected to the bias voltage terminal Vbias1. A source terminal of M12 is connected to a drain terminal of the NMOS transistor M13. A gate terminal of the NMOS transistor M13 is connected to the bias voltage terminal Vbias0, and a source terminal of M13 is connected to the ground GND.

As shown in FIG. 7, the compensation circuit in this embodiment may include the compensation capacitor Ctail and the compensation resistor Rtail. The positive terminal of the compensation resistor Ctail is connected to the output terminal Vout of the operational amplifier, and is connected to the drain terminal of the PMOS transistor M11 and the drain terminal of the NMOS transistor M12. The negative terminal of the compensation capacitor Ctail is connected to the source terminals of the NMOS transistors M3 and M4 and the drain terminal of the NMOS transistor M2, and a positive terminal of the compensation capacitor Ctail is connected to a negative terminal of the compensation resistor Rtail. It should be noted that a connection sequence of the compensation capacitor Ctail and the compensation resistor Rtail in practical applications is not limited. In other words, in addition to the above connection modes, the following connection modes may also be used: the negative terminal of the compensation resistor Rtail is connected to the source terminals of the NMOS transistors M3 and M4 and the drain terminal of the NMOS transistor M2; the positive terminal of the compensation capacitor Ctail is connected to the output terminal Vout of the operational amplifier, and also to the drain terminal of the PMOS transistor M11 and the drain terminal of the NMOS transistor M12; and the positive terminal of the compensation resistor Rtail is connected to the negative terminal of the compensation capacitor Ctail.

As shown in FIG. 7, the positive feedback tuning circuit in this embodiment may include the positive feedback tuning capacitor Cadd. The positive terminal of the positive feedback tuning capacitor Cadd is connected to the drain terminal of the NMOS transistor M3 and the source terminal of the NMOS transistor M5. A negative terminal of the positive feedback tuning capacitor Cadd is connected to the ground GND.

The operational amplifier based on Miller compensation shown in FIG. 8 and the operational amplifier based on cascode compensation shown in FIG. 9 will be compared with the operational amplifier based on tail current compensation in embodiments of the present application below to explain the reason why the operational amplifier based on tail current compensation in embodiments of the present application has better power supply rejection performance at high frequencies.

Figure 8:
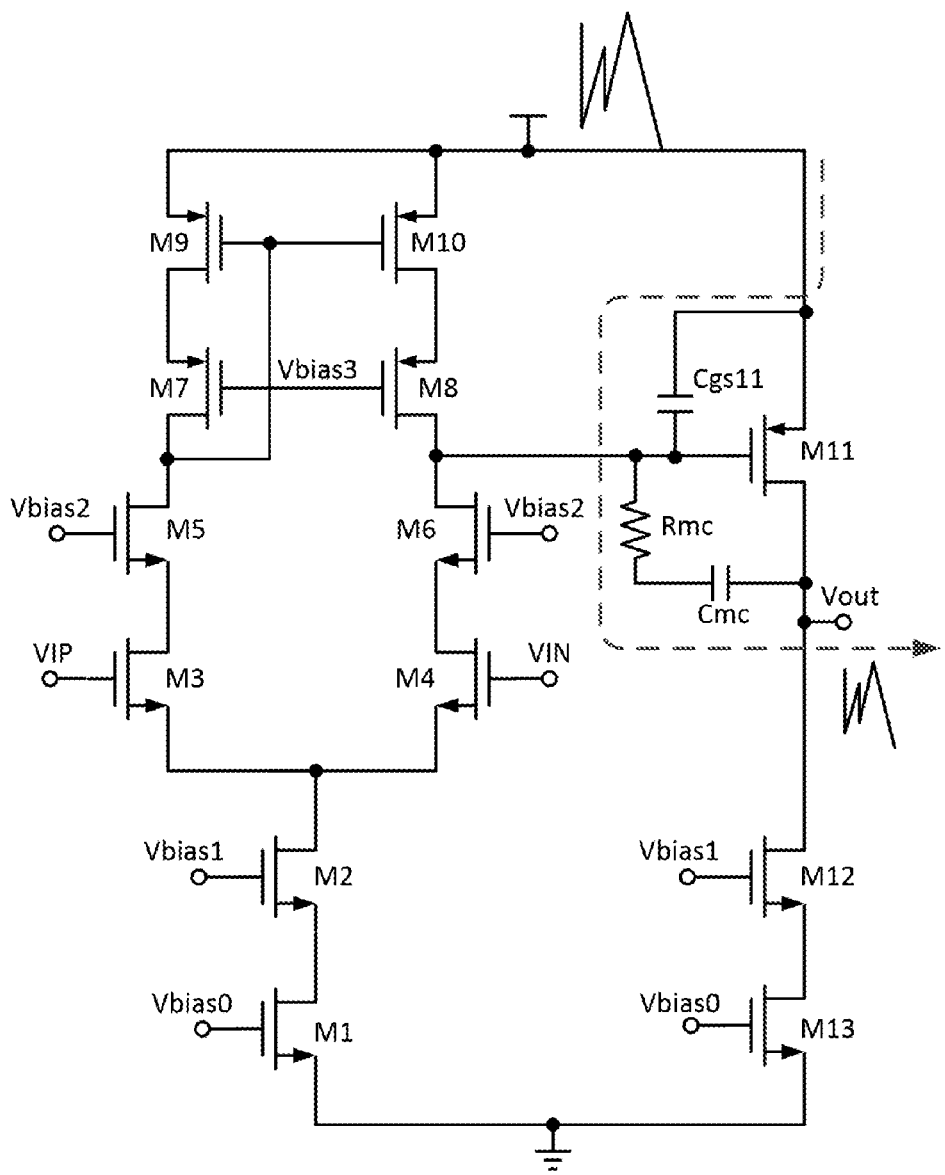
FIG. 8 is a schematic structural diagram of a circuit of an operational amplifier based on Miller compensation.

FIG. 8 shows an operational amplifier based on Miller compensation which generally has a large-size output transistor. At high frequencies, it is necessary to consider power supply rejection deterioration introduced by a gate-source parasitic capacitor Cgs11 of M11. As the frequency increases, the interference on a power supply is coupled to the gate terminal of M11 through Cgs11, and then coupled to the output terminal Vout through a Miller compensation resistor Rmc and a Miller compensation capacitor Cmc, thereby deteriorating the power supply rejection of the operational amplifier at high frequencies.

Figure 9:
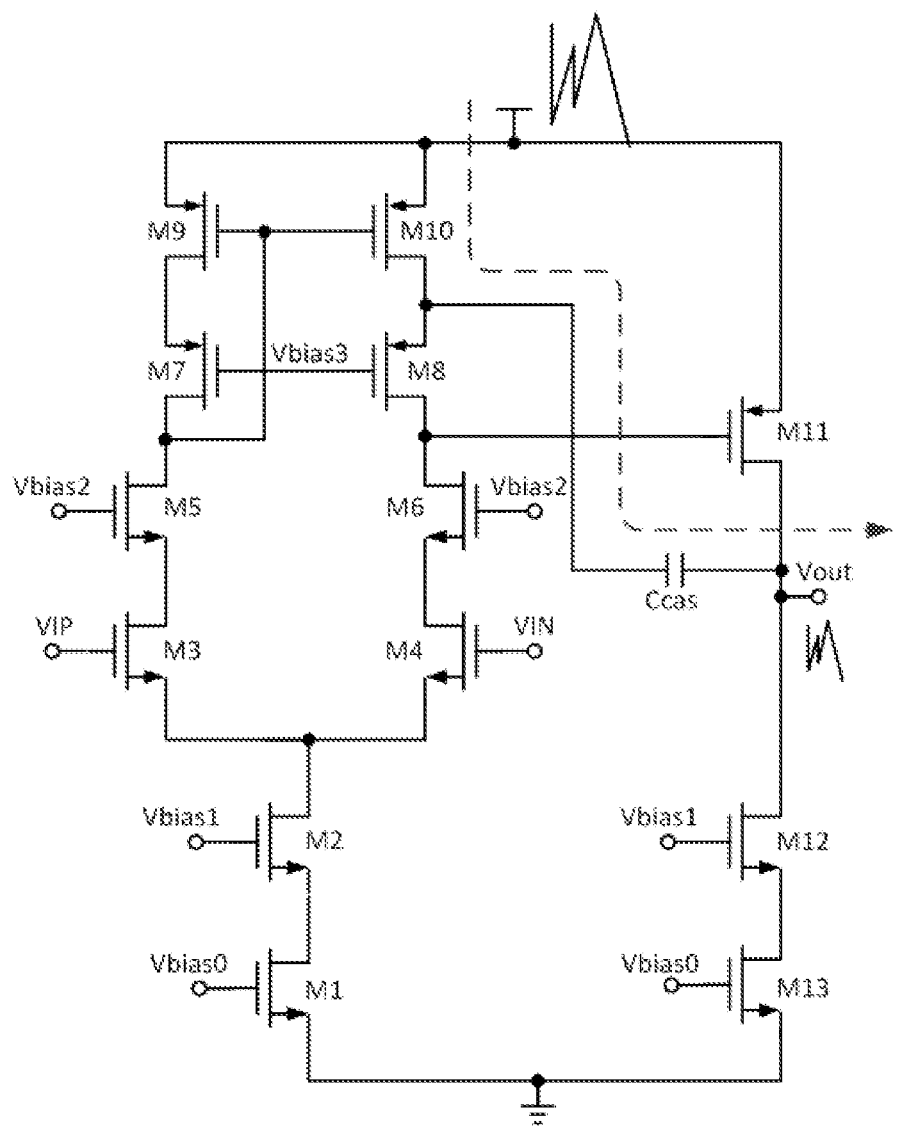
FIG. 9 is a schematic structural diagram of a circuit of an operational amplifier based on cascode compensation.

FIG. 9 shows an operational amplifier based on cascode compensation. Since a compensation capacitor Ccas is not connected to the gate terminal of the PMOS output transistor M11, there is no need to consider the gate-source parasitic capacitor Cgs11 of M11 during high-frequency analysis. As the frequency increases, the interference on the power supply is coupled to the drain terminal of M4 through the PMOS transistors M10 and M8 and the NMOS transistor M6 and at the same time, coupled to the output terminal Vout from M10 and the cascode compensation capacitor Ccas. Since M10, M8, and M6 have higher rejection effects on power noise than the gate-source parasitic capacitor Cgs11, the power noise coupled to the output terminal Vout through the cascode compensation capacitor Ccas is much lower than that of the Miller compensation structure, thereby improving the power supply rejection of the operational amplifier at high frequencies.

Figure 10:
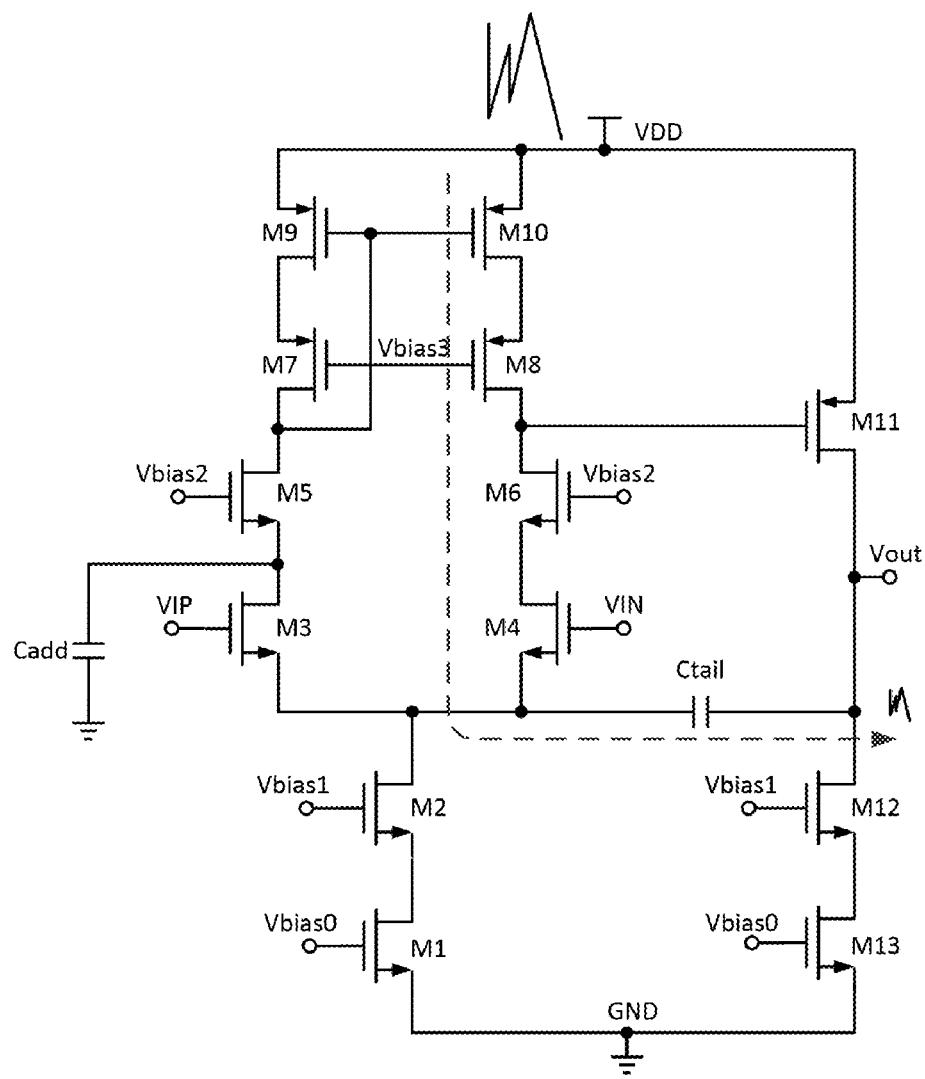
FIG. 10 is a schematic diagram of power supply rejection of an operational amplifier based on tail current compensation provided by an embodiment of the present application.

FIG. 10 shows a circuit structure of an operational amplifier based on tail current compensation in an embodiment of the present application. Since the compensation capacitor Ctail is not connected to the gate terminal of the PMOS output transistor M11, there is also no need to consider the gate-source parasitic capacitor Cgs11 of M11 during high-frequency analysis. As the frequency increases, the interference on the power supply is coupled to the drain terminal of M2 through the PMOS transistors M10 and M8 and the NMOS transistors M6 and M4, and then coupled to the output terminal Vout through a tail current compensation capacitor Ctail. Since the source terminal of M5 is connected to a feedforward tuning capacitor Cadd which is grounded, power noise coupled from M9, M7, and M5 is short-circuited to the ground and will not be coupled to the output terminal. In this way, the tail current compensation capacitor passes through more rejection paths, such that the power noise coupled to the output terminal through the compensation capacitor is lower than that of the cascode compensation structure, so the power supply rejection characteristics at high frequencies are better.

Figure 11:
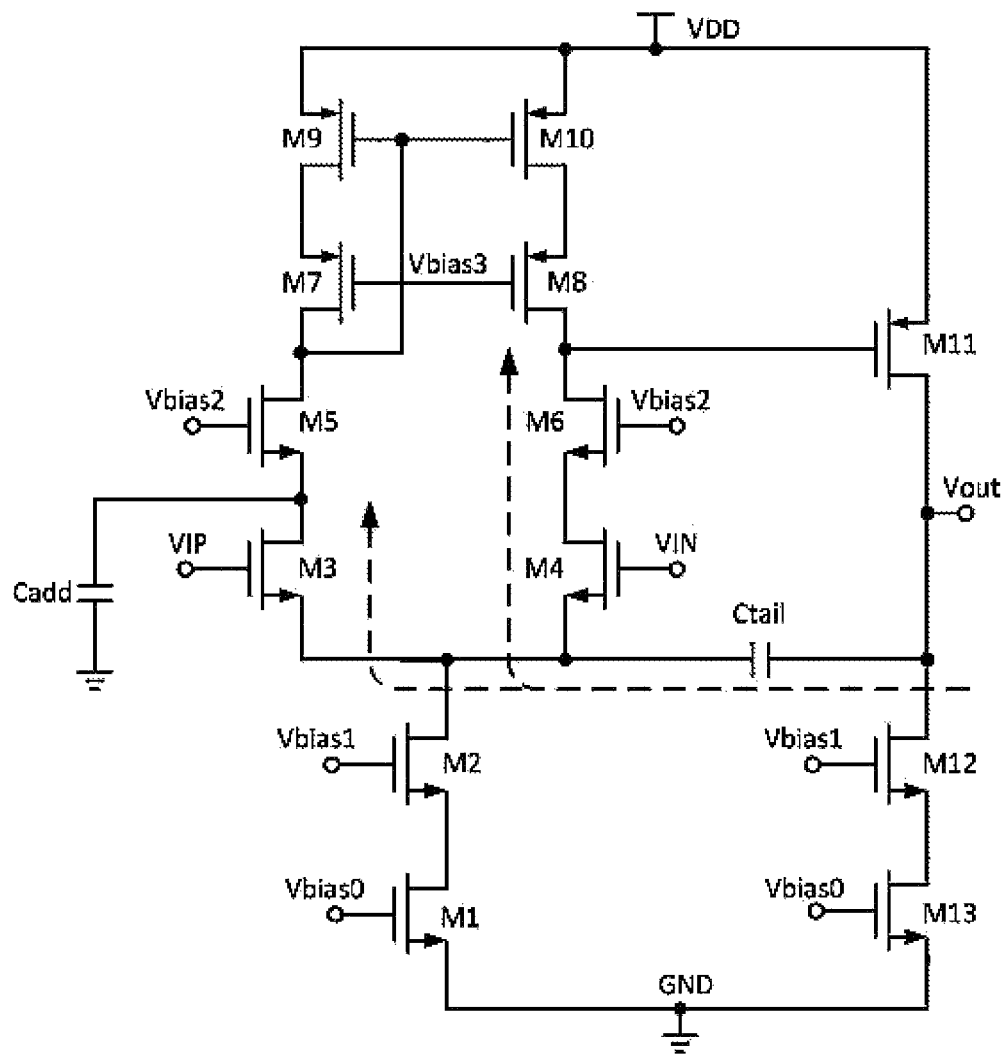
FIG. 11 is a schematic diagram of positive feedback rejection of an operational amplifier based on tail current compensation provided by an embodiment of the present application.

As shown in FIG. 11, after the compensation capacitor Ctail is introduced to the operational amplifier in the embodiments of the present application, a positive feedback loop in which an output signal passes through M3, M5, M10, M8, and M11 is formed. In this way, the gain of the positive feedback loop can be attenuated by introducing a positive feedback tuning circuit. In the embodiments of the present application, as shown in FIG. 11, one implementation of the positive feedback tuning circuit is to use a ground capacitor Cadd. The ground capacitor Cadd is connected to the drain terminal of M3 and the source terminal of M5, which ensures the stability of the operational amplifier.

The circuit stability when an LDO circuit is constructed by the operational amplifiers based on Miller compensation, cascode compensation and tail current compensation will be illustrated below.

Values and compensation results of compensation devices in the operational amplifier based on Miller compensation, cascode compensation, and tail current compensation are compared in Table 1. Table 1 shows the comparison of the values and compensation results of compensation devices under the same phase margin. It can be seen that under the condition of equal or approximately equal phase margins, the tail current compensation has a minimum compensation capacitance and a maximum gain margin; and the Miller compensation has a maximum compensation capacitance and a minimum gain margin.

TABLE 1

| | Values of compensation devices | Phase margin | Gain margin |
|---|---|---|---|
| Miller compensation | Cmc = 2 pF; Rmc = 10k | 65.60 | 12.05 |
| Cascode compensation | Ccas = 1.2 pF | 66.00 | 13.24 |
| Tail current compensation | Ctail = 1 pF; Cadd = 10 pF | 66.00 | 18.55 |

Figure 12:
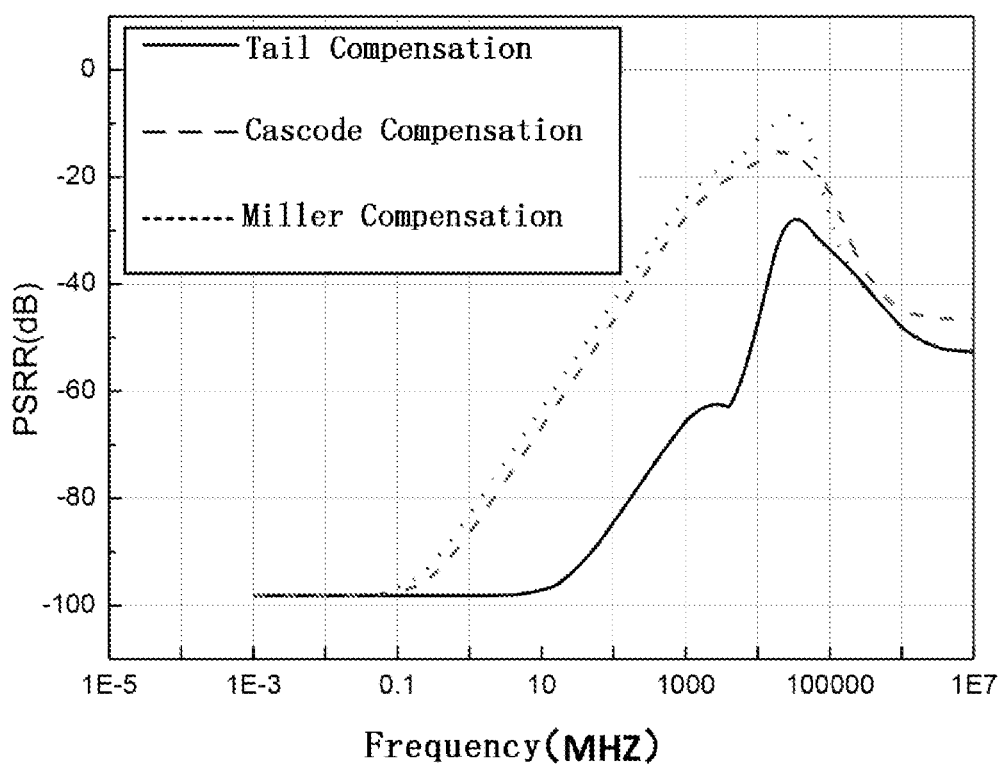
FIG. 12 is a schematic diagram showing comparison of power supply rejection simulation results of LDOs constructed by operational amplifiers based on different compensation modes.

FIG. 12 shows simulation results of power supply rejection performances when the LDO is constructed by operational amplifiers based on different compensation modes. The solid line corresponds to tail current compensation, and two dashed lines correspond to cascode compensation and Miller compensation, respectively. It can be seen from FIG. 12 that the LDO constructed by the operational amplifier based on Miller compensation has a maximum power supply rejection ratio (PSRR) of −4.90 dB; the LDO constructed by the operational amplifier based on cascode compensation has a maximum PSRR of −12.64 dB; and the LDO constructed by the operational amplifier based on tail current compensation has a maximum PSRR of −25.19 dB. It can thus be seen that the maximum PSRR of the LDO constructed by the operational amplifier based on tail current compensation in the embodiments of the present application at a higher frequency can be increased by about 20 dB compared with the LDO constructed by the operational amplifier based on Miller compensation.

A person having ordinary skill in the art shall understand that all or some of steps in the methods disclosed above, and functional modules/units in systems and devices can be implemented as software, firmware, hardware and their appropriate combination. In the hardware implementation, the division between functional modules/units mentioned in the above description does not necessarily correspond to the division of physical components. For example, one physical component may have a plurality of functions, or one function or step may be executed by several physical components in cooperation. Some physical components or all physical components can be implemented as software executed by a processor, such as a digital signal processor or a microprocessor, or as hardware, or as an integrated circuit, such as an application specific integrated circuit. Such software may be distributed on a computer-readable medium, and the computer-readable medium may include a computer storage medium (or a non-transitory medium) and a communication medium (or a transitory medium). It is well-known to a person having ordinary skill in the art that the term "computer storage medium" includes volatile and nonvolatile, removable and non-removable medium implemented by any method or technology for storing the information, such as, computer readable instructions, data structures, program modules or other data. The computer storage medium includes, but is not limited to a random access memory (RAM), a read-only memory (ROM), an electrically erasable programmable read only memory (EEPROM), a flash memory or other memory techniques, a compact disc read-only memory (CD-ROM), a digital video disk (DVD) or other optical storage, a tape cartridge, a magnetic tape, a disk storage or other magnetic storage devices, or any other medium that may be configured to store desired information and may be accessed by a computer. In addition, it is well-known to a person having ordinary skill in the art that communication media usually contain computer-readable instructions, data structures, computer program modules, or other data in a modulated data signal such as a carrier wave or other transmission mechanism, and may include any information delivery medium.

The invention claimed is:

1. An operational amplifier, comprising a first-stage gain circuit, a second-stage gain circuit, a tail current compensation circuit and a positive feedback tuning circuit, wherein
the first-stage gain circuit is connected to the second-stage gain circuit and provided with an input terminal, the second-stage gain circuit is provided with an output terminal;
the first-stage gain circuit at least comprises a tail current source, a first terminal of the tail current compensation circuit is connected to the tail current source, and a second terminal of the tail current compensation circuit is connected to the output terminal of the second-stage gain circuit;
the tail current compensation circuit is configured to compensate the tail current source with an output signal of the output terminal of the second-stage gain circuit, and
a first terminal of the positive feedback tuning circuit is connected to the first-stage gain circuit, a second terminal of the positive feedback tuning circuit is connected to ground, and the positive feedback tuning circuit is configured to reject a positive feedback signal introduced by the tail current compensation circuit.

2. The operational amplifier of claim 1, wherein
the tail current compensation circuit comprises a compensation capacitor.

3. The operational amplifier of claim 2, wherein the tail current compensation circuit further comprises a compensation resistor which is connected in series with the compensation capacitor.

4. The operational amplifier of claim 1, wherein the positive feedback tuning circuit comprises one of, or a series-parallel combination of at least two of:
a capacitor;
a resistor;
an inductor; and
an active device.

5. The operational amplifier of claim 1, wherein
the first-stage gain circuit further comprises a first-stage amplifying circuit and a current mirror load circuit, the first-stage amplifying circuit is connected to the current mirror load circuit, and to the tail current source and the tail current compensation circuit.

6. The operational amplifier of claim 5, wherein the first-stage amplifying circuit comprises at least one of:
a cascode amplifying circuit with differential input and single-ended output; and
a common-source amplifying circuit with differential input and single-ended output.

7. The operational amplifier of claim 6, wherein the second-stage gain circuit comprises at least one of:
a common-source amplifying circuit with single-ended input and single-ended output; and
a cascode amplifying circuit with single-ended input and single-ended output.

8. The operational amplifier of claim 5, wherein
the first-stage amplifying circuit comprises an amplifying circuit with differential input and differential output; and
the second-stage gain circuit comprises an amplifying circuit with single-ended and single-ended output.

9. The operational amplifier of claim 5, wherein
the current mirror load circuit comprises a cascode current mirror circuit.

* * * * *